United States Patent
Kitagawa et al.

(10) Patent No.: US 6,804,154 B2
(45) Date of Patent: Oct. 12, 2004

(54) SEMICONDUCTOR MEMORY DEVICE INCLUDING POWER GENERATION CIRCUIT IMPLEMENTING STABLE OPERATION

(75) Inventors: Makoto Kitagawa, Hyogo (JP); Takeshi Hamamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/455,388

(22) Filed: Jun. 6, 2003

(65) Prior Publication Data

US 2004/0120192 A1 Jun. 24, 2004

(30) Foreign Application Priority Data

Dec. 18, 2002 (JP) ........................................ 2002-366755

(51) Int. Cl.⁷ ............................................ G11C 11/34
(52) U.S. Cl. .............................. 365/189.09; 365/230.03
(58) Field of Search ........................ 365/189.09, 230.03

(56) References Cited

U.S. PATENT DOCUMENTS 4,994,688 A * 2/1991 Horiguchi et al. .......... 327/541
6,064,621 A 5/2000 Tanizaki et al. ......... 365/230.03
6,087,891 A * 7/2000 Yoon et al. .................. 327/530

FOREIGN PATENT DOCUMENTS

| JP | 54-137246 | 10/1979 |
| JP | 11-203862 | 7/1999 |
| JP | P2001-256781 A | 9/2001 |

* cited by examiner

*Primary Examiner*—M. Tran
(74) *Attorney, Agent, or Firm*—McDermott Will & Emery LLP

(57) ABSTRACT

An array power generation circuit supplying an array power supply voltage to a corresponding memory array block and a peripheral power generation circuit supplying a peripheral power supply voltage to a peripheral circuit are arranged around each memory array block. Respective power supply voltages are generated under the same reference voltage level, and transmitted in an array power supply line and a peripheral power supply line. An N channel MOS transistor is connected between the array power supply line of the array power generation circuit and the peripheral power supply line of the peripheral power generation circuit. The N channel MOS transistor is turned on when the gate thereof receives a boosted voltage from a booster circuit, and electrically couples the array power supply line and the peripheral power supply line.

5 Claims, 9 Drawing Sheets

SEMICONDUCTOR MEMORY DEVICE INCLUDING POWER GENERATION CIRCUIT IMPLEMENTING STABLE OPERATION

BACKGROUND OF THE INVENTION

1. Field of the Invention

The present invention relates to a semiconductor memory device and, more specifically, to a semiconductor memory device including a power generation circuit for supplying an array power supply voltage and a peripheral power supply voltage respectively to a memory array and a peripheral circuit.

2. Description of the Background Art

To implement a stable and high-speed operation in a semiconductor memory device, a memory array is divided into a plurality of memory blocks which are arranged with sense amplifier circuits on both sides thereof, whereby each bit line pair is shortened to decrease the load thereof to transmit memory cell data having a sufficient voltage level to the sense amplifier circuit at high speed in order to accelerate a sense operation.

In such a structure, a power supply voltage and a ground voltage are supplied to the sense amplifier circuit to sense and amplify memory cell data of a corresponding column. When the power supply voltage and the ground voltage are transmitted for a long distance, levels of the power supply voltage and the ground voltage vary due to a wire resistance of a power supply line supplying the power supply voltage, which makes it impossible to perform an accurate sense operation. In addition, the power supply voltage cannot be supplied to the sense amplifier circuit at high speed due to the wire resistance. When a voltage level of an array power supply voltage decreases, a voltage level transmitted to a power supply node of the sense amplifier decreases and an operation speed of the sense amplifier decreases, which also causes degradation in sensitivity. If a sense margin decreases due to the degraded sensitivity, an accurate sense operation of the memory cell data may be inhibited.

To prevent such a decrease in sense margin and stably supply the sense power supply voltage and the ground voltage to the sense amplifier circuit, a mesh power supply arrangement is used in which power supply lines and ground lines are arranged in a mesh structure over a memory array.

In the mesh power supply arrangement, however, a power supply circuit is provided on one side of the memory block, and a distance from the power supply circuit to each memory cell in the memory block differs. Therefore, there is a difference in values of equivalent resistances of power supply lines, and thus the amounts of power supply voltage drops differ. For a memory cell located at the most distant point from the power supply circuit, for example, the wire resistance of the power supply line becomes the largest, and thus a desired power supply voltage cannot be supplied. Therefore, a margin to an array operation becomes smaller due to the voltage drop caused by the wire resistance of the power supply line, and thus the stable operation cannot be ensured.

One of the solutions for such a problem is to increase a wire width of the power supply line to decrease the resistance. By increasing the wire width, however, a dimension of the circuit undesirably increases, or a degree of freedom for a layout is limited.

Thus, recently, a semiconductor memory device as described in Japanese Patent Laying-Open No. 2001-256781, for example, has been suggested which includes a structure such that, a power supply driver is arranged near a sense power supply line of each of a plurality of sense amplifier bands, and a current is supplied from a power supply node to the sense power supply line of the corresponding sense amplifier band during an operation of the corresponding sense amplifier band. With this, a current can be supplied to the sense power supply line at high speed, and a decrease in a sense power supply voltage can be suppressed.

A semiconductor memory device as described in Japanese Patent Laying-Open No. 11-203862, for example, has also been suggested which includes a structure such that, a rectangular semiconductor substrate region is divided into subregions having a plurality of rows and a plurality of columns, and a control circuit is arranged in a central region, while a memory array block is arranged in a remaining region surrounding the central region. In such an arrangement structure, a peripheral power supply circuit is arranged in the central region, which allows to supply a power supply voltage to each memory array block with a minimum interconnection length, and to suppress an effect of voltage drop due to a wire resistance of a power supply line. In addition, a sense amplifier power supply circuit is arranged extending in a relatively large region around the memory array block region on either side of the semiconductor substrate region in one direction. The sense amplifier power supply circuit includes a decoupling capacity having a large capacity value to compensate for a large current consumption which flows during a sense amplifier operation and to suppress a significant sense amplifier power supply voltage. Therefore, by arranging the sense amplifier power supply circuit in a peripheral region having a larger area, a decoupling capacity requiring the larger area can be formed with a sufficient margin, and the sense amplifier power supply voltage can stably be generated.

The former of the semiconductor memory devices, however, cannot suppress an increase in a circuit dimension involved in the power supply driver arrangement, because the power supply driver must be arranged corresponding to each of the plurality of sense amplifier bands to stably supply the sense power supply voltage.

In the latter of the semiconductor memory devices, as a region having the same size as the divided memory block arrangement is kept as a control circuit formation region, and as the sense amplifier power supply circuit occupying a large area is further arranged in the peripheral region, the area of the circuit undesirably increases while the stable and high-speed operation is implemented.

SUMMARY OF THE INVENTION

An object of the present invention is to provide a semiconductor memory device implementing a stable and high-speed array operation by suppressing a decrease in a power supply voltage without involving a increase in a circuit dimension.

A semiconductor memory device according to the present invention includes a memory array including a plurality of memory blocks each having a plurality of memory cells arranged in columns and rows, and the plurality of memory blocks are arranged aligned in a row direction and a column direction. The semiconductor memory device includes an array power generation circuit provided corresponding to each memory block for generating an array power supply voltage transmitted to the plurality of memory cells based on a first reference voltage, an array power supply line for supplying the array power supply voltage to the memory block, a peripheral power generation circuit provided corresponding to each memory block for generating a power supply voltage based on a second reference voltage at a same potential as the first reference voltage for a peripheral circuit included in each of the corresponding memory block and performing an operation for a memory cell selection, a peripheral power supply line for supplying the power supply voltage for the peripheral circuit to the peripheral circuit, and a connection transistor for electrically coupling the array power supply line to the peripheral power supply line.

As described above, in the semiconductor memory device according to the present invention, when the array power supply voltage has the same reference voltage as the peripheral power supply voltage, the array power supply line and the peripheral power supply line transmitting respective power supply voltages are electrically coupled using the connection transistor, whereby a voltage drop of the array power supply voltage due to the wire resistance can be mitigated and a stable array operation can easily be implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
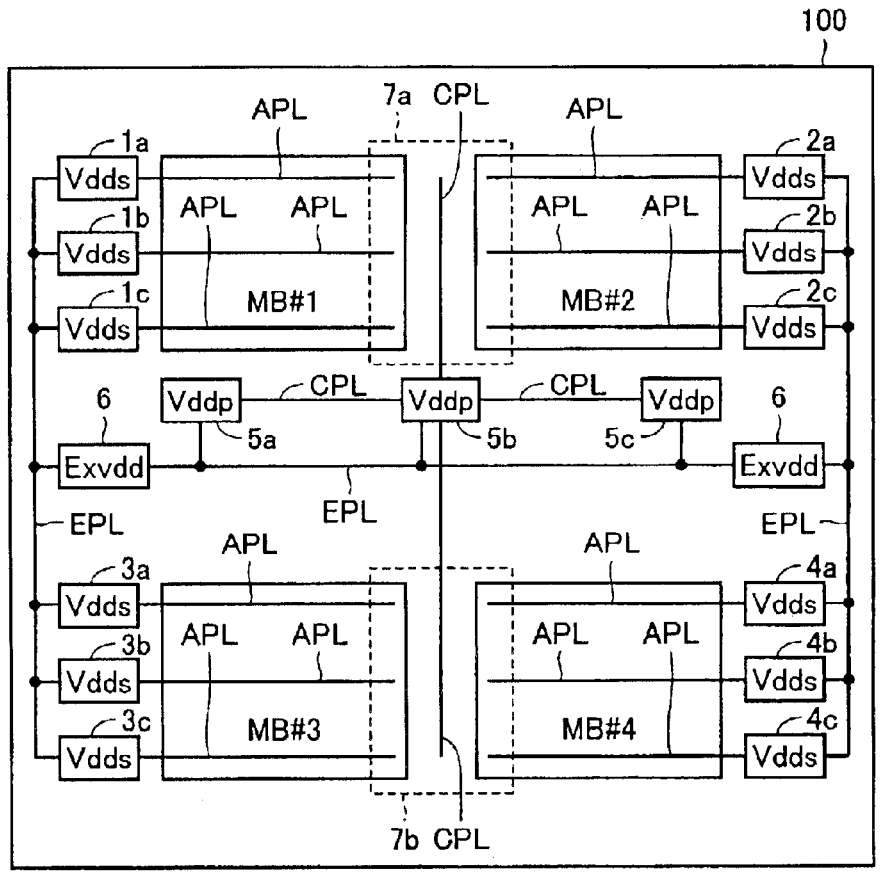
FIG. 1 schematically shows a structure of a memory mat in a semiconductor memory device according to a first embodiment of the present invention.

Embodiments of the present invention will now be described in detail referring to the drawings. Herein, the same or corresponding portions in the drawings are indicated by the same characters and the descriptions thereof will not be repeated.

[First Embodiment]

FIG. 1 schematically shows a structure of a memory mat in a semiconductor memory device according to a first embodiment of the present invention.

In FIG. 1, a memory mat 100 is divided into four memory array blocks MB#1–MB#4 each having a plurality of memory cells arranged in columns and rows. Array power generation circuits 1a, 1b, 1c–4a, 4b, 4c for generating an array power supply voltage Vdds transmitted to corresponding memory array blocks, peripheral power generation circuits 5a, 5b, 5c for generating a peripheral power supply voltage Vddp supplied to a peripheral circuit which is not shown, and an external power supply circuit 6 are arranged around the memory array blocks. Around memory array block MB#1, for example, array power generation circuits 1a, 1b, 1c and peripheral power generation circuits 5a, 5b are provided. Hereafter, array power generation circuits 1a, 1b, 1c–4a, 4b, 4c and peripheral power generation circuits 5a, 5b, 5c are also collectively referred to as an array power generation circuit and a peripheral power generation circuit, respectively.

In this drawing, powers are supplied from the power generation circuits to memory array blocks MB#1–MB#4 and a peripheral circuit which is not shown via an array power supply line APL and a peripheral power supply line CPL arranged in a mesh structure on memory mat 100. Into memory array block MB#1, for example, array power supply voltage Vdds is supplied from array power generation circuits 1a, 1b, 1c respectively via array power supply line APL. Peripheral power supply voltage Vddp is supplied from peripheral power generation circuits 5a, 5b to the peripheral circuit (not shown) via peripheral power supply line CPL.

External power supply circuit 6 is arranged between adjacent memory array blocks, and an external power supply voltage Exvdd is transmitted to the corresponding array power generation circuit and peripheral power generation circuit via an external power supply line EPL arranged extending around the memory array blocks. The array power generation circuit and peripheral power generation circuit receive external power supply voltage Exvdd at external power supply nodes provided within the circuits as described below, and respectively generate desired power supply voltages.

Figure 2:
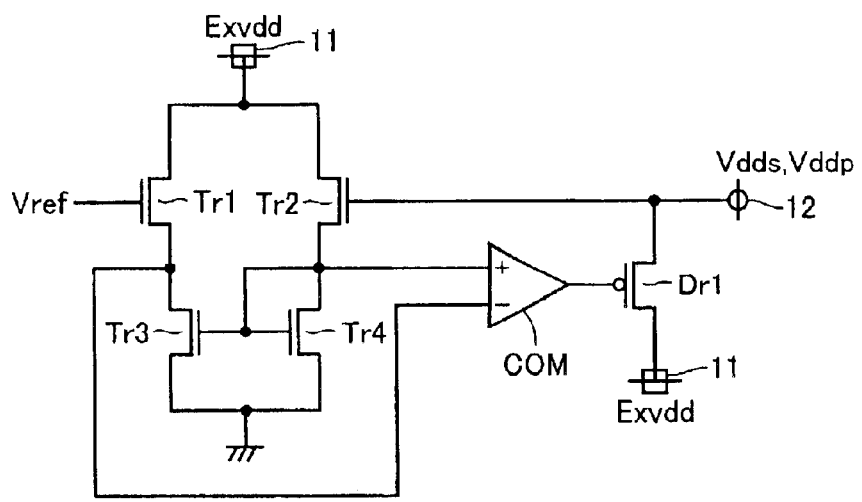
FIG. 2 shows an example of a structure of an array power generation circuit and a peripheral power generation circuit shown in FIG. 1.

FIG. 2 shows an example of a structure of the array power generation circuit and peripheral power generation circuit shown in FIG. 1. As the array power generation circuit and peripheral power generation circuit have a common structure, these circuits are also collectively referred to as a power generation circuit hereafter.

Referring to FIG. 2, the power generation circuit includes a current mirror differential amplifier formed with N channel MOS transistors Tr1–Tr4, a comparator COM comparing two voltage levels output from the current mirror differential amplifier, and a drive transistor Dr1 connected between an array (or a peripheral) power supply node 12 and an external power supply node 11 and supplying a current from external power supply node 11 to array (or peripheral) power supply node 12 according to an output signal of comparator COM.

N channel MOS transistors Tr1, Tr2 are respectively connected between external power supply node 11 and drains of N channel MOS transistors Tr3, Tr4. N channel MOS transistor Tr1 receives a reference voltage Vref at the gate thereof. N channel MOS transistors Tr2 receives array (or peripheral) power supply voltage Vdds (or Vddp) from array (or peripheral) power supply node 12 at the gate thereof.

N channel MOS transistors Tr3, Tr4 are respectively connected between sources of N channel MOS transistors Tr1, Tr2 and a ground potential. In addition, the gate of N channel MOS transistor Tr3 is connected to the gate and drain of N channel MOS transistor Tr4 to form a current mirror circuit. Drains of N channel MOS transistors Tr3, Tr4 are respectively connected to first and second input terminals of comparator COM.

The power generation circuit shown in FIG. 2 compares reference voltage Vref and the array (or peripheral) power source voltage with the current mirror differential amplifier, and differentially amplifies the comparison result with comparator COM. When the differentially-amplified comparison result signal is input to drive transistor Dr1, drive transistor Dr1 is set to an on/off state in response to the comparison result signal to electrically couple/isolate external power supply node 11 and array (or peripheral) power supply node 12. Because a current is supplied to array (or peripheral) power supply node 12 from external power supply node 11 as such, the array (or peripheral) power supply voltage is held at the voltage level of reference voltage Vref. The array (or peripheral) power supply voltage of a desired voltage level is generated by setting the voltage level of reference voltage Vref to a proper value.

When the voltage level of the array (or peripheral) power supply voltage is lower than that of reference voltage Vref, the output signal of comparator COM is set to the L (logic low) level to turn on drive transistor Dr1, and a current is supplied from external power supply node 11 to array (or peripheral) power supply node 12 to increase the voltage level of the array (or peripheral) power supply voltage.

Herein, external power supply voltage Exvdd supplied to external power supply node 11 is transmitted from external power supply circuit 6 via external power supply line EPL, as shown in FIG. 1. Thus, when external power supply voltage Exvdd is transmitted for a long distance, a potential level of external power supply node 11 drops to be lower than that of external power supply voltage Exvdd due to the wire resistance of external power supply line EPL. As the potential of external power supply node 11 drops, a gate-source potential Vgs of drive transistor Dr1 decreases, and thus current drivability of drive transistor Dr1 decreases. Therefore, because the array (or peripheral) power supply voltage of the desired voltage level cannot be generated, a power supply capability to the memory array block (or peripheral circuit) is impaired.

Referring back to FIG. 1, array power supply voltage Vdds generated in the array power generation circuit shown in FIG. 2 is supplied to a corresponding memory array block MB#n (MB#1–MB#4). As array power supply line APL also has a wire resistance, array power supply voltage Vdds drops within one memory array block proportionally to the distance from the array power generation circuit. Therefore, in a memory cell located on the most distant point from the array power generation circuit, an accurate array operation may be impossible because a sufficient array operation margin cannot be ensured due to the decreased voltage level of array power supply voltage Vdds.

Thus, in this embodiment, an interconnection structure of the power source lines as described below is adopted in regions 7a, 7b indicated by dotted lines in FIG. 1, in which peripheral power supply line CPL and array power supply line APL are arranged, to mitigate the drop of the voltage level of the array power supply voltage.

Figure 3A:
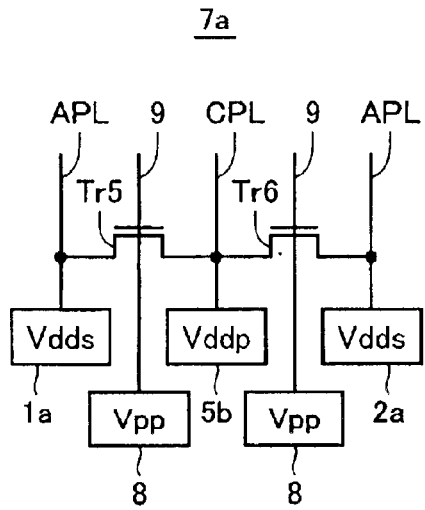
FIGS. 3A and 3B schematically show interconnection structures of power supply lines in a region 7a in the memory mat of the semiconductor memory device shown in FIG. 1.
Figure 3B:
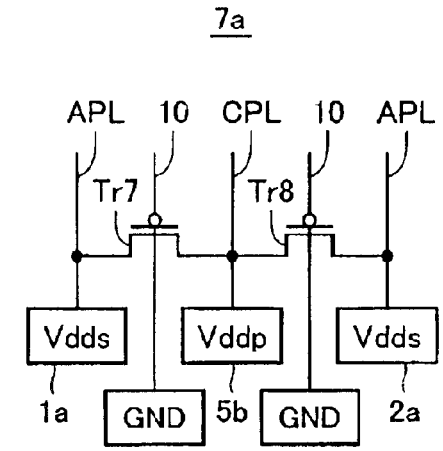

FIGS. 3A and 3B schematically show interconnection structures of power supply lines in region 7a in memory mat 100 of the semiconductor memory device shown in FIG. 1. As regions 7a, 7b have a common interconnection structure, the interconnection structure in region 7a is representatively shown. FIG. 3B shows a modified example of the interconnection structure shown in FIG. 3A.

Referring to FIG. 3A, an N channel MOS transistor Tr5 is arranged between array power supply line APL of array power generation circuit 1a and peripheral power supply line CPL of peripheral power generation circuit 5b. Similarly, an N channel MOS transistor Tr6 is arranged between array power supply line APL of array power generation circuit 2a and peripheral power supply line CPL of peripheral power generation circuit 5b. In this embodiment, the MOS transistor is applied as a representative example of a connection transistor used as a switching circuit.

N channel MOS transistors Tr5, Tr6 have gates connected to a booster circuit 8 for generating a boosted voltage Vpp used for a word line drive potential or the like, and receive boosted voltage Vpp to continuously be driven to an on-state. Herein, N channel MOS transistors Tr5, Tr6 are made to be driven with boosted voltage Vpp because, by selecting a potential which can sufficiently turn on the transistor, the current drivability increases and the size of the transistor itself becomes smaller, which suppresses the increase in the circuit dimension due to the arrangement of connection transistors.

Therefore, array power supply line APL and peripheral power supply line CPL are electrically coupled continuously by N channel MOS transistors Tr5, Tr6 driven to the on-state. With this, as array power supply voltage Vdds is at the same potential as peripheral power supply voltage Vddp, the voltage drop of array power supply voltage Vdds is mitigated by feed from peripheral power supply line CPL.

The interconnection structures of power supply lines shown in FIGS. 3A, 3B are established on the precondition that, array power supply voltage Vdds has the same reference voltage Vref as that of peripheral power supply voltage Vddp. In addition, though a single connection transistor may be provided for a plurality of array power supply lines APLs and the peripheral power supply lines CPLs, efficiency of a chip layout and a degree of freedom of the layout can increase by providing a plurality of connection transistors for respective power supply lines.

In addition, though array power supply line APL and peripheral power supply line CPL are coupled by the N channel MOS transistor in FIG. 3A, the similar effect can be obtained with the coupling by a P channel MOS transistor, as shown in FIG. 3B.

FIG. 3B schematically shows a modified example of the interconnection structure of the power supply lines in region 7a.

As shown in FIG. 3B, P channel MOS transistors Tr7, Tr8 are arranged between array power supply lines APLs and peripheral power supply line CPL. Thus, a ground potential GND which can sufficiently turn on each transistor is applied to the gates of P channel MOS transistors Tr7, Tr8. Therefore, as described with FIG. 3A, array power supply line APL and peripheral power supply line CPL are continuously coupled, and the voltage drop of array power supply voltage Vdds is mitigated.

Figure 4A:
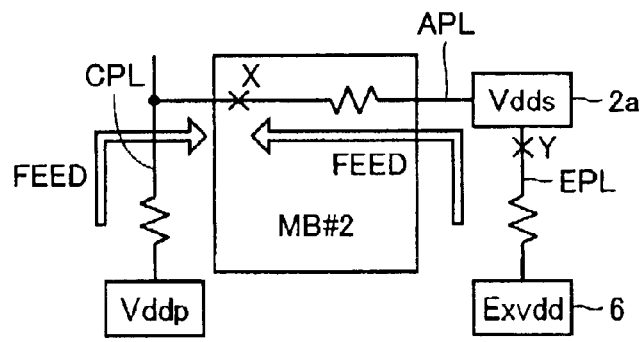
FIG. 4A schematically shows a method of supplying an array power supply voltage Vdds in the semiconductor memory device according to the first embodiment of the present invention.
Figure 4B:
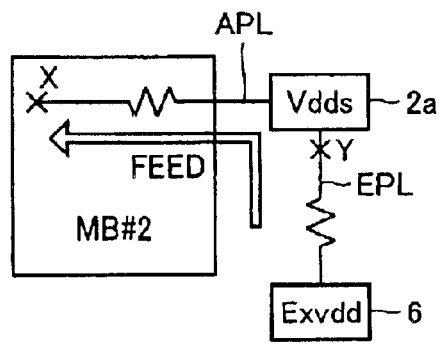
FIG. 4B schematically shows the supplying method in a conventional semiconductor memory device.

FIGS. 4A, 4B schematically show a method of supplying array power supply voltage Vdds in the semiconductor memory device according to the first embodiment of the present invention (FIG. 4A) in comparison with the supplying method in a conventional semiconductor memory device (FIG. 4B). As the supplying method for each memory array block is common, a situation in which array power supply voltage Vdds is supplied to memory array block MB#2 shown in FIG. 1 is described as an example.

Figure 5:
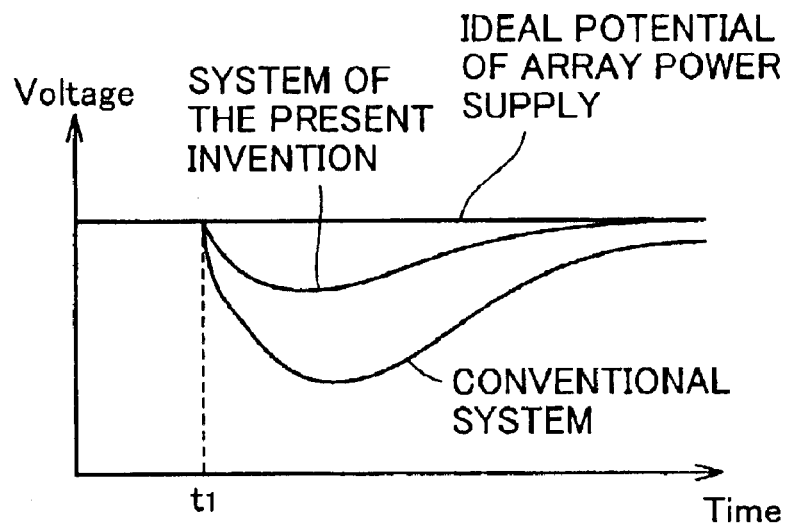
FIG. 5 schematically shows array power supply voltage waveforms at the most distant point from the array power generation circuit in the array power supply voltage supplying method shown in FIGS. 4A and 4B.

In addition, FIG. 5 schematically shows potential waveforms of array power supply line APL observed at the most distant point from the array power generation circuit with the two supplying methods shown in FIGS. 4A, 4B.

Referring to FIG. 4A, external power supply voltage Exvdd is supplied from external power supply circuit 6 to array power generation circuit 2a via external power supply line EPL. In this situation, external power supply voltage Exvdd supplied to array power generation circuit 2a located on the most distant point Y from external power supply circuit 6 drops due to the wire resistance of external power supply line EPL. Array power generation circuit 2a then generates array power supply voltage Vdds having a voltage level of reference voltage Vref based on the supplied external power supply voltage Exvdd, and supplies the generated voltage to memory array block MB#2.

In this situation, the voltage drop due to the wire resistance of array power supply line APL occurs within memory array block MB#2 proportionally to the distance from array power generation circuit 2a. In particular, the largest dropping amount is obtained for the voltage level of the most distant point X from array power generation circuit 2a (referred to as an array-power-most-distant-point hereafter).

The above-described supplying method is similar to that in the conventional semiconductor memory device shown in FIG. 4B. As shown in FIG. 5, the potential of array-power-most-distant-point X with the conventional supplying method shows a waveform such that, the potential decreases from an ideal value of array power supply voltage Vdds (equivalent to reference voltage Vref) after an array operation starting time (time t=t1). Further, the potential of array-power-most-distant-point X is gradually restored by activating a current supply to array power supply node 12 in the array power generation circuit shown in FIG. 2. Therefore, with the conventional supplying method, a stable operation cannot be ensured because a sufficient array operation margin in the array operation cannot be obtained due to the decrease in the array power supply voltage.

Thus, in this embodiment, array power supply line APL and peripheral power supply line CPL are electrically coupled by the MOS transistor as shown in FIG. 4A to form a feed path from peripheral power generation circuit 5b in addition to a feed path from array power generation circuit 2a for array-power-most-distant-point X. With this, an amount of decrease in the voltage level at array-power-most-distant-point X due to the wire resistance of array power supply line APL is suppressed to provide a potential waveform as shown in FIG. 5. According to this embodiment, a stable operation can be implemented because an effect of the wire resistance at array-power-most-distant-point X can be suppressed.

Figure 6:
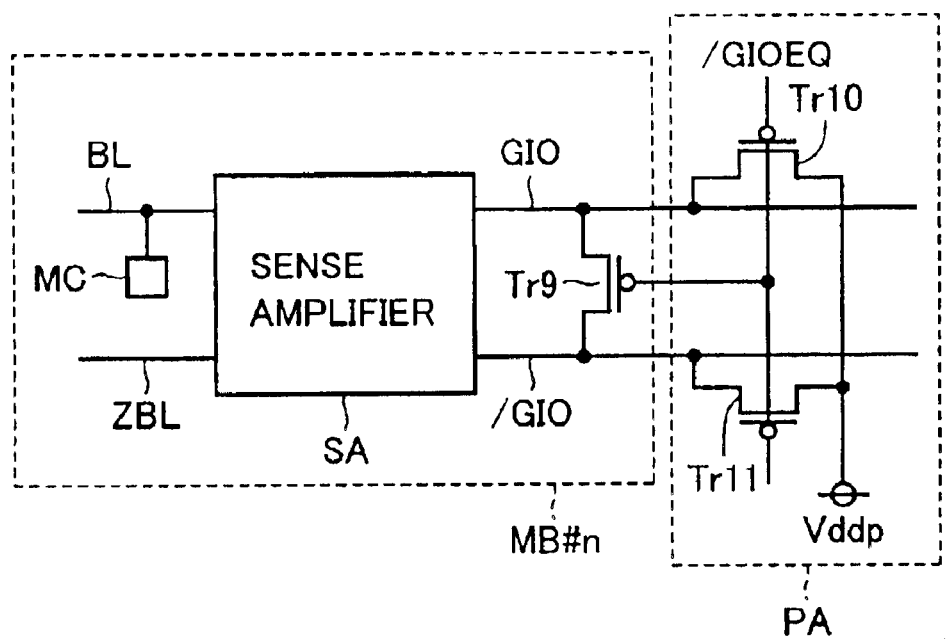
FIG. 6 shows a structure of a sense amplifier and a peripheral portion thereof in the semiconductor memory device according to the first embodiment of the present invention.

FIG. 6 shows a structure of a sense amplifier and a peripheral portion thereof in the semiconductor memory device according to the first embodiment of the present invention.

In FIG. 6, when the word line which is not shown is driven to a selection state, an access transistor (not shown) included in a memory cell MC is brought into conduction, and a potential change corresponding to data stored in memory cell MC occurs in a bit line BL. A complementary bit line ZBL, on the other hand, maintains a voltage level of a precharge state. When a potential difference between the bit line pair BL, ZBL is sufficiently amplified, a sense activation signal is activated. The ground potential and sense power supply voltage are supplied to a sense amplifier SA, and sense amplifier SA starts a sense operation. By this sense operation, bit line pair BL, ZBL are respectively driven to the ground voltage level and the sense power supply voltage level corresponding to stored data.

Further, gate circuits which are not shown are respectively provided between sense amplifier SA and global input and output lines GIO, /GIO. The gate circuits which are not shown electrically couple sense amplifier SA and respective global input and output lines GIO, /GIO in response to activation of a corresponding column selection signal of each column selection line (not shown). When activated in response to each column selection signal, sense amplifier SA outputs data to global input and output lines GIO, /GIO.

In the structure shown in FIG. 6, a P channel MOS transistor Tr9 is connected between global input and output lines GIO, /GIO. Further, P channel MOS transistors Tr10, Tr11 as precharge transistors are respectively connected between global input and output lines GIO, /GIO and peripheral power supply node Vddp. P channel MOS transistors Tr10, Tr11 have gates connected to a GIO line-equalizing line /GIOEQ, and electrically couple peripheral power supply node Vddp and global input and output lines GIO, /GIO respectively corresponding to the potential level thereof. Gates of P channel MOS transistors Tr10, Tr11 are further connected to the gate of P channel MOS transistor Tr9. Therefore, when P channel MOS transistors Tr9, Tr10, Tr11 are turned on in response to the activation of GIO line-equalizing line /GIOEQ to the L level, global input and output lines GIO, /GIO are equally precharged to peripheral power supply voltage Vddp level.

As shown in FIG. 6, sense amplifier SA and P channel MOS transistor Tr9 are arranged in memory array block MB#n and are driven with array power supply voltage Vdds supplied to memory array block MB#n. This is because, if sense amplifier SA is formed to be driven by peripheral power supply voltage Vddp, new peripheral power supply line CPL must be arranged in memory array block MB#n, and that degrades the efficiency of the interconnection area.

On the other hand, P channel MOS transistors Tr10, Tr11 are arranged in a preamplifier PA accommodated in a peripheral circuit band. As shown in FIG. 6, in preamplifier PA, P channel MOS transistors Tr10, Tr11 are driven to precharge global input and output lines GIO, /GIO to the voltage level of peripheral power supply voltage Vddp, and the lines are further shunted by P channel MOS transistor Tr9 in memory array block MB#n. With this structure, charge efficiency of the global input and output line pair can be enhanced.

Figure 7:
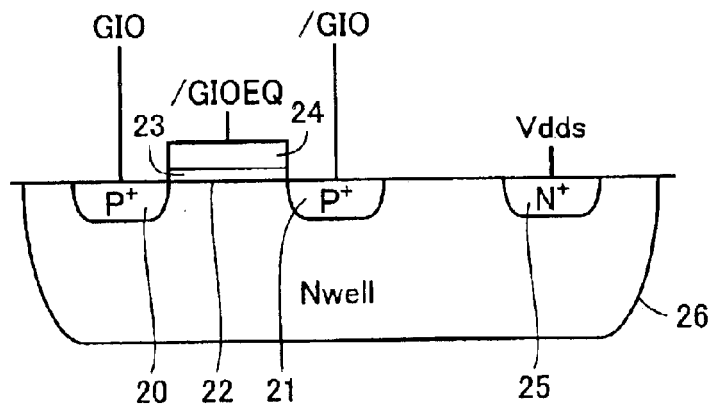
FIG. 7 shows a cross-sectional structure of a P channel MOS transistor Tr9 shown in FIG. 6.

FIG. 7 shows a cross-sectional structure of P channel MOS transistor Tr9 shown in FIG. 6.

Referring to FIG. 7, P channel MOS transistor Tr9 includes P$^+$diffusion regions 20, 21 provided within an N well 26 and a channel formation region 22 arranged between P$^+$ diffusion regions 20, 21.

P$^+$ diffusion regions 20, 21 are respectively connected to global input and output lines GIO, /GIO via contacts which are not shown. A gate electrode 24 is formed above channel formation region 22 between P$^+$ diffusion regions 20, 21 with an insulator film 23 interposed therebetween. Gate electrode 24 is further connected to GIO line-equalizing line /GIOEQ via a contact which is not shown. N well 26 is connected to array power supply line APL with regard to interconnection efficiency, and the potential thereof is fixed to array power supply voltage Vdds.

If a potential drop due to the wire resistance of array power supply line APL as described above occurs in P channel MOS transistor Tr9 having such a structure, it causes a malfunction as described below.

Figure 8A:
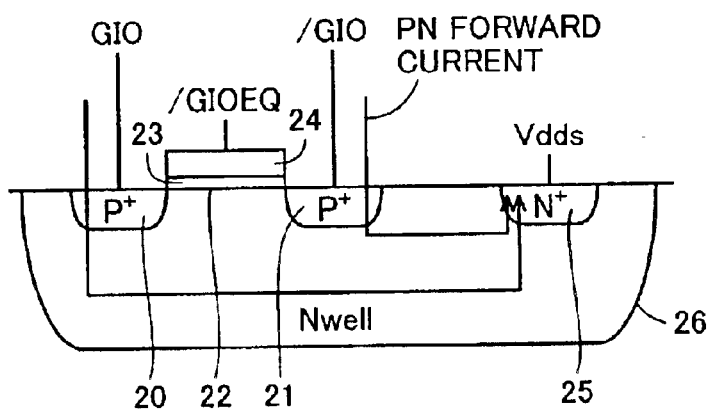
FIG. 8A is a schematic diagram for describing a malfunction that occurs in P channel MOS transistor Tr9 at precharging of global input and output lines GIO, /GIO.
Figure 8B:
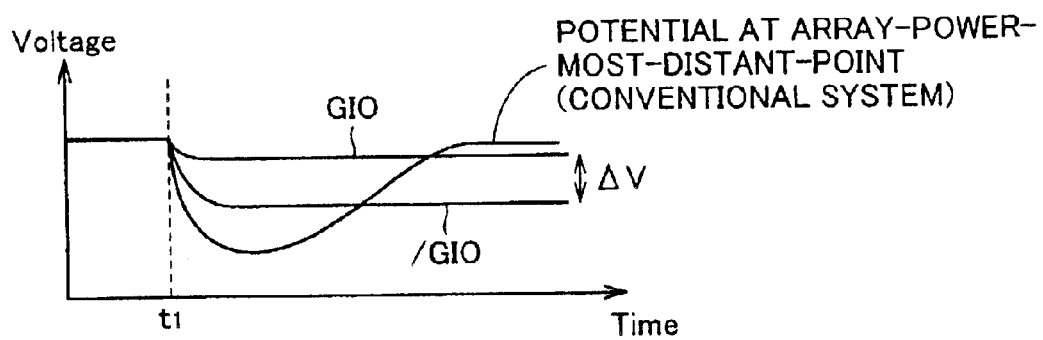
FIG. 8B shows voltage waveforms of global input and output lines GIO, /GIO.

FIG. 8A is a schematic diagram for describing the malfunction that occurs in P channel MOS transistor Tr9 at precharging of global input and output lines GIO, /GIO. FIG. 8B shows voltage waveforms of global input and output lines GIO, /GIO.

Referring to FIG. 8A, when GIO line-equalizing line /GIOEQ connected to the gate of P channel MOS transistor Tr9 is activated to the L level, global input and output lines GIO, /GIO are electrically coupled and equally precharged to peripheral power supply voltage Vddp level. In the conventional semiconductor memory device in which array power supply line APL and peripheral power supply line CPL are electrically isolated, when array power supply voltage Vdds as a potential of N well 26 drops in this situation, peripheral power supply voltage Vddp will have a potential higher than that of array power supply voltage Vdds, and PN junctions in a forward direction as indicated by arrows in FIG. 8A will be formed between P$^+$ diffusion regions 20, 21 and an N$^+$ diffusion region 25. When the PN junctions are formed, a forward current flows through N well 26 in a direction indicated by the arrow. Therefore, the voltage level decreases because both of global input and output lines GIO, /GIO are floating nodes.

When N$^+$ diffusion region 25 fixing the potential of N well 26 and P$^+$ diffusion regions 20, 21 are arranged as shown in FIG. 8A, potential levels of global input and output line pair GIO, /GIO will be unbalanced because resistance values of forward current paths are different from each other. As shown in FIG. 8B, the potential difference between global input and output lines GIO, /GIO is such that, the potential of global input and output line /GIO is lower than that of global input and output line GIO by ΔV. The potential difference ΔV is kept constant because, when sense amplifier SA starts the sense operation, GIO line-equalizing line /GIOEQ is driven to a non-active state and global input and output lines GIO, /GIO are not charged by peripheral power supply voltage Vddp. Therefore, sensitivity of global input and output lines GIO, /GIO is degraded due to potential difference ΔV, and a sufficient data reading margin may not be ensured.

In addition, when sense amplifier SA starts the sense operation during the array operation, charge and discharge currents of a large number of bit lines are generated, and array power supply voltage Vdds drops due to the charge and discharge currents. On the other hand, the voltage levels of global input and output lines GIO, /GIO only slightly drop due to small charge and discharge currents generated in a peripheral circuit. Therefore, when array power supply voltage Vdds and potentials of global input and output lines GIO, /GIO are driven by separate power supplies as in the conventional semiconductor memory device, array power supply voltage Vdds will have a potential lower than that of global input and output lines GIO, /GIO, and the PN forward current as shown in FIG. 8A is generated.

On the contrary, in the semiconductor memory device of this embodiment, because the interconnection structure is such that array power supply line APL and peripheral power supply line CPL are coupled by the MOS transistor as shown in FIG. 3, array power supply line APL and peripheral power supply line CPL always have the same potential, and the PN forward current as shown in FIG. 8A cannot be generated. Therefore, the unbalance between the potentials of global input and output lines GIO, /GIO is eliminated, and the sufficient reading margin can be ensured.

As described above, according to the first embodiment of the present invention, dropping of the array power supply voltage due to the wire resistance can be mitigated to ensure a sufficient array operation margin by electrically coupling power supply lines transmitting respective power supply voltages in the semiconductor memory device in which reference voltages of the array power supply voltage and the peripheral power supply voltage are at the same potential.

In addition, as the array power supply line and the peripheral power supply line are coupled by the connection transistor, a stable and high-speed array operation can be implemented without involving an increased circuit dimension.

[Second Embodiment]

Generally, screening must be performed to previously remove an early fault by performing acceleration operation aging for a certain time for devices and removing defectives. A burn-in test is commonly adopted in these days as one of procedures for the screening. The burn-in test is a procedure which enables direct evaluation of dielectric films using real devices, and reveals various defective factors such as a migration of aluminum interconnection by applying stresses of high temperature and high electric field.

During the burn-in test, a power supply voltage and an electric field stress higher than those in a normal operation are usually applied to transistors forming a control circuit. In this situation, to apply the stress to a gate electrode film, sometimes a high voltage is applied to the gate of a transistor forming a peripheral circuit, and a further higher voltage is applied to a transistor forming a memory cell. Alternatively, a voltage applied to the transistor of the peripheral circuit may be higher than that for the transistor of the memory cell. This may occur because the transistor forming the peripheral circuit and the transistor forming the memory cell have different gate oxide film withstand voltages due to a difference in gate oxide film thicknesses or the like.

Therefore, in the burn-in test, it is necessary for the array power generation circuit and peripheral power generation circuit to be able to supply different power supply voltages respectively to the memory cell and peripheral circuit. Thus, in this embodiment, a semiconductor memory device is suggested in which, in the semiconductor memory device of the first embodiment shown in FIG. 1, the structure of continuously connecting array power supply line APL and peripheral power supply line CPL is developed into a structure of electrically isolating the power supply lines when entering a test mode such as the burn-in test. The structure of the semiconductor memory device of this embodiment will now be described in detail.

Figure 9:
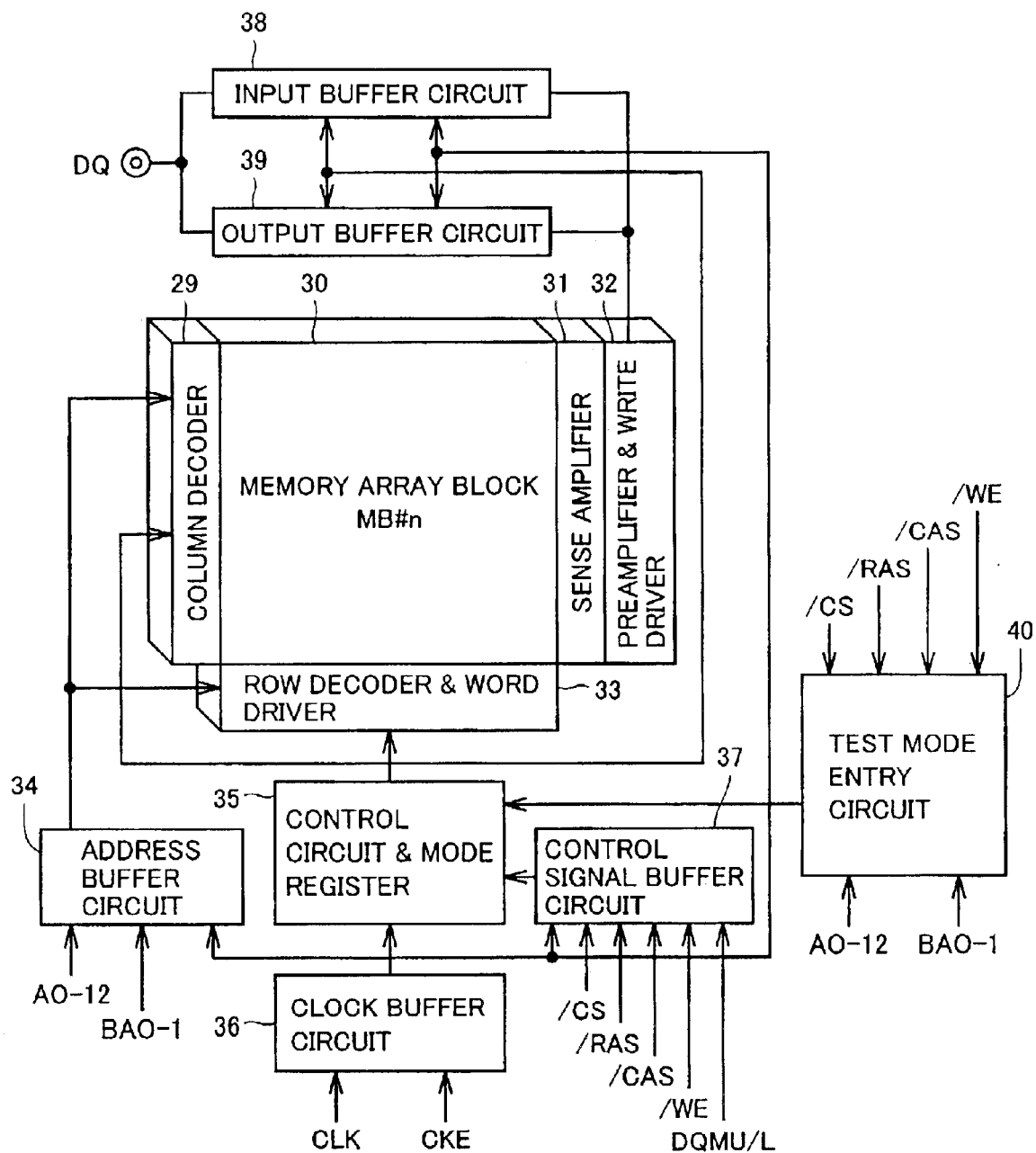
FIG. 9 schematically shows a structure of one memory array block MB#n and a peripheral circuit in a semiconductor memory device according to a second embodiment of the present invention.

FIG. 9 schematically shows a structure of one memory array block MB#n and a peripheral circuit in the semiconductor memory device according to the second embodiment of the present invention.

Referring to FIG. 9, the semiconductor memory device includes a memory array block MB#n (MB#1–MB#4) 30 having a plurality of memory cells arranged in columns and rows, a row decoder & word driver 33 for decoding a provided row address signal and driving the addressed row of memory array block MB#n to a selection state, a column decoder 29 for decoding a provided column address signal and selecting the addressed column of memory array block MB#n 30, a sense amplifier 31 arranged corresponding to each column of memory array block MB#n 30 to sense, amplify and latch memory cell data on the corresponding column, and a preamplifier & write driver 32 formed with a preamplifier further amplifying stored data of a selected memory cell sensed with the sense amplifier and a drive circuit for writing data to the selected memory cell.

The semiconductor memory device further includes an address buffer circuit 34 generating an internal address signal from address signals A0-12, BA0-1 provided from the outside to control an access to memory array block MB#n 30, a clock buffer circuit 36 generating an internal clock signal from a clock enable signal CKE and an external clock signal CLK, a control circuit & mode register 35 generating a control signal for controlling the whole semiconductor memory device and a mode specification signal, a control signal buffer circuit 37 receiving a row address strobe signal /RAS, a column address strobe signal /CAS, a write control signal /WE, a chip select signal /CS, and the internal clock signal and generating a control signal, and an input buffer circuit 38 and an output buffer circuit 39 inputting and outputting a signal of a logic level corresponding to a voltage between global input and output line pair GIO, /GIO, which are not shown, to the outside as write data.

The semiconductor memory device of this embodiment further includes a test mode entry circuit 40 generating a test signal TSIG for controlling an entry into a test mode for performing the burn-in test or the like.

Test mode entry circuit 40 is arranged within a memory array mat and generates test signal TSIG based on an address signal and control signals from the outside. The control signals include row address strobe signal /RAS, column address strobe signal /CAS, write control signal /WE, and chip select signal /CS. The test mode entry circuit determines a combination of logic states of these signals, and generates test signal TSIG based on the determination result. The generated test signal TSIG is input to control circuit & mode register 35 and then transmitted to a connection transistor arranged in memory array block MB#n, as described below.

Figure 10:
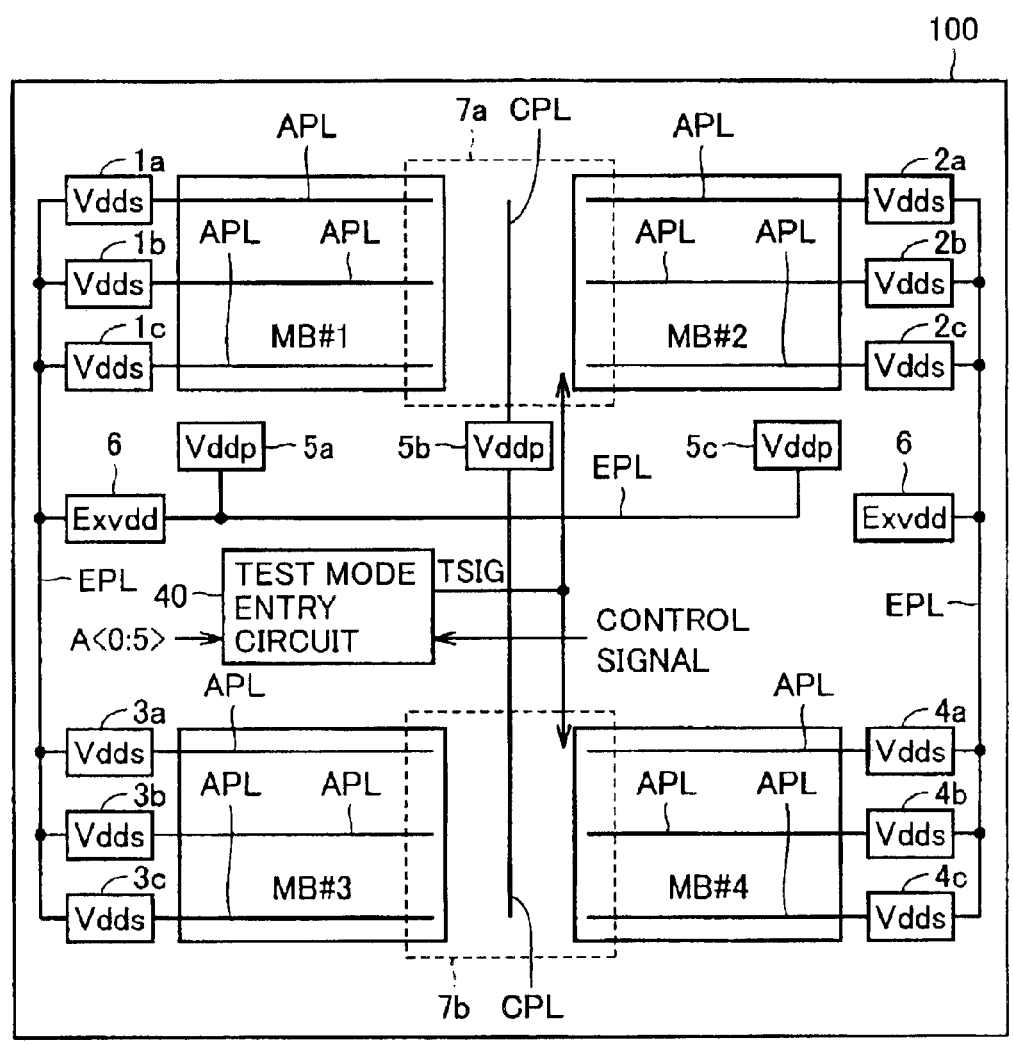
FIG. 10 schematically shows a structure of a memory mat according to the second embodiment of the present invention.

FIG. 10 schematically shows a structure of the memory mat according to the second embodiment of the present invention.

Referring to FIG. 10, the semiconductor memory device of this embodiment has a structure such that, test mode entry circuit 40 is arranged in memory mat 100 in the semiconductor memory device of the first embodiment shown in FIG. 1, and thus the descriptions of the common portions will not be repeated.

When address signals A<0:5> and the control signals are input from the outside, test mode entry circuit 40 generates test signal TSIG with a combination of these signals. Test signal TSIG is transmitted to regions 7a, 7b where array power supply line APL crosses peripheral power supply line CPL.

Figure 11A:
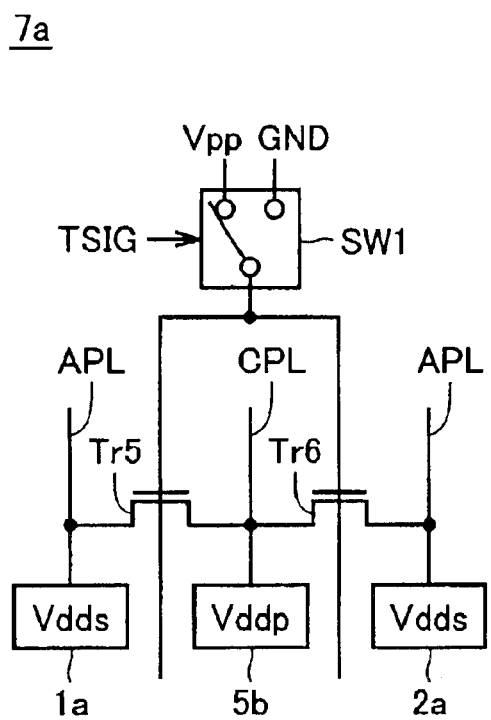
FIGS. 11A and 11B schematically show interconnection structures of power supply lines in region 7a shown in FIG. 10.
Figure 11B:
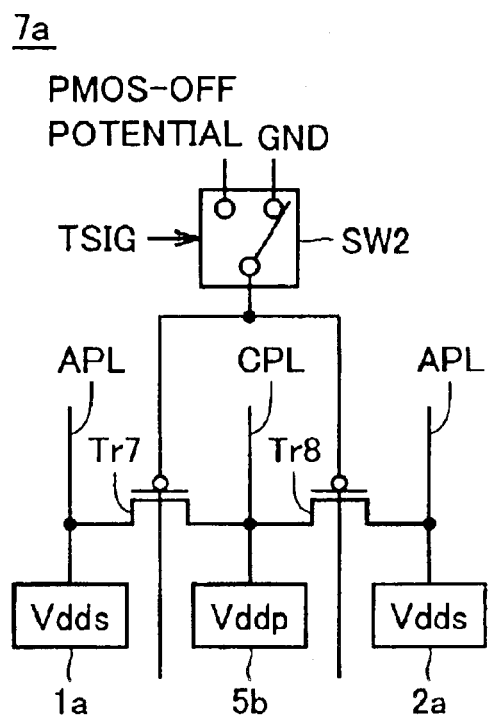

FIGS. 11A and 11B schematically show interconnection structures of power supply lines in region 7a shown in FIG. 10. As regions 7a, 7b shown in FIG. 10 have a common interconnection structure, the interconnection structure in region 7a is representatively shown.

Referring to FIG. 11A, N channel MOS transistors Tr5, Tr6 are arranged as connection transistors between array power supply lines APLs and peripheral power supply line CPL. Gates of N channel MOS transistors Tr5, Tr6 are connected to a switch SW1. Switch SW1 uses test signal TSIG as a control signal, and selectively applies boosted voltage Vpp or ground potential GND to the gates of N channel MOS transistors Tr5, Tr6 corresponding to the potential level thereof.

As described below, test signal TSIG transits between two potential levels, that is, the H level and the L level. The semiconductor memory device enters the test mode when test signal TSIG is at the H level, and transits to a normal operation when the signal is at the L level.

When test signal TSIG is at the H level, that is, when entering the test mode, switch SW1 applies ground potential GND to the gates of N channel MOS transistors Tr5, Tr6. With this, both of N channel MOS transistors Tr5, Tr6 are turned off, and array power supply line APL and peripheral power supply line CPL are electrically isolated. Therefore, peripheral power generation circuit 5b and array power generation circuits 1a, 2a can respectively supply independent power supply voltages.

On the other hand, when test signal TSIG is at the L level, that is, during the normal operation, switch SW1 applies boosted voltage Vpp to the gates of N channel MOS transistors Tr5, Tr6. With this, both of N channel MOS transistors Tr5, Tr6 are turned on, and array power supply line APL and peripheral power supply line CPL are electrically coupled. Therefore, as array power supply line APL and peripheral power supply line CPL are kept at the same potential, the voltage drop of array power supply voltage Vdds due to the wire resistance can be mitigated with feed from peripheral power supply line CPL.

FIG. 11B is a modified example of the interconnection structure of the power supply lines shown in FIG. 11A. In this structure, P channel MOS transistors Tr7, Tr8 are arranged between array power supply lines APLs and peripheral power supply line CPL. Gates of P channel MOS transistors Tr7, Tr8 are connected to a switch SW2. Switch SW2 uses test signal TSIG as a control signal, and selectively applies a potential which can sufficiently turn off the P channel MOS transistor (which is referred to as a PMOS-off potential hereafter) or ground potential GND to the gates of P channel MOS transistors Tr7, Tr8 corresponding to the potential level thereof.

In the structure described above, when test signal TSIG is at the H level (on test mode entry), switch SW2 applies the PMOS-off potential to the gates of P channel MOS transistors Tr7, Tr8. With this, P channel MOS transistors Tr7, Tr8 are turned off and array power supply line APL and peripheral power supply line CPL are electrically isolated, which enables each power generation circuit to supply an independent power supply voltage.

On the other hand, when test signal TSIG is at the L level (during the normal operation), switch SW2 applies ground potential GND to the gates of P channel MOS transistors Tr7, Tr8. With this, both of P channel MOS transistors Tr7, Tr8 are turned on, and array power supply line APL and peripheral power supply line CPL are electrically coupled. Therefore, the voltage drop of array power supply voltage Vdds due to the wire resistance is mitigated.

Figure 12A:
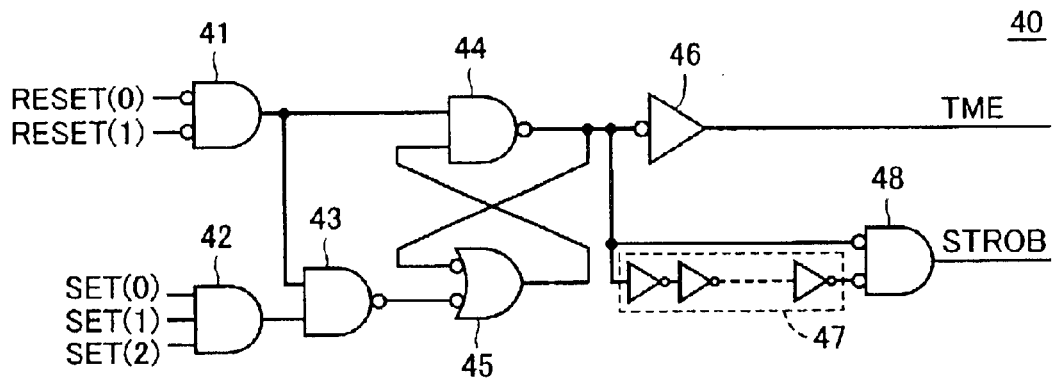
FIGS. 12A–12C show structures of an example of respective signal generation units forming a test mode entry circuit 40.
Figure 12B:
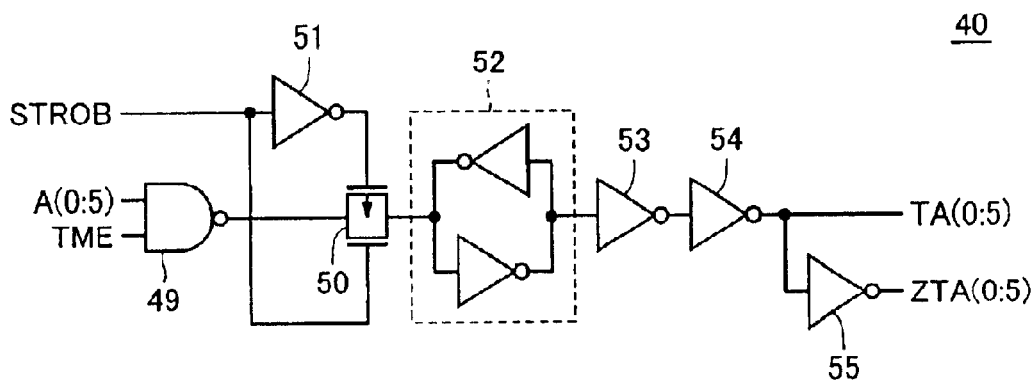
Figure 12C:
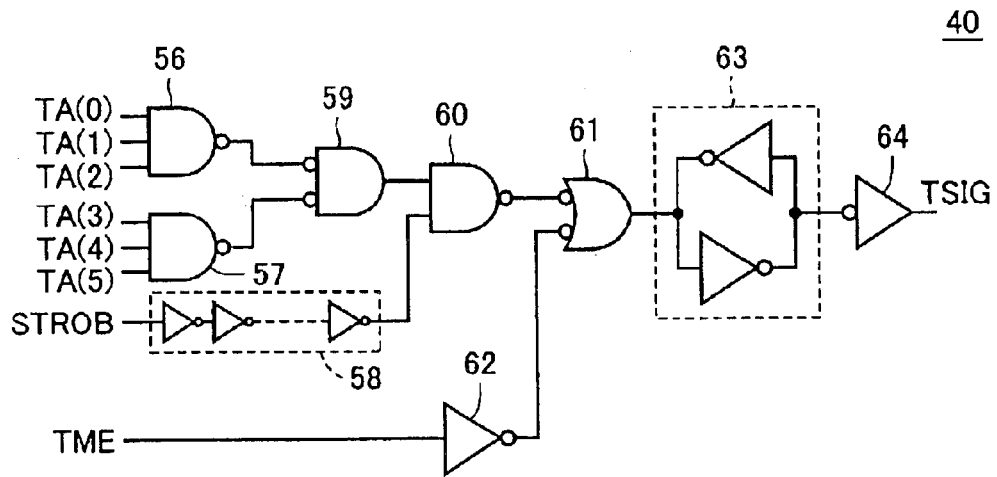

FIGS. 12A–12C show details of an example of respective signal generation units forming test mode entry circuit 40.

Referring to FIGS. 12A–12C, test mode entry circuit 40 is formed with a test mode entry signal generation unit (FIG. 12A), a test mode address generation unit (FIG. 12B) and a test signal generation unit (FIG. 12C).

FIG. 12A shows a structure of an example of the test mode entry signal generation unit.

Referring to FIG. 12A, the test mode entry signal generation unit includes a two-input AND circuit 41 to which reset signals RESET are input, a three-input AND circuit 42 to which set signals SET are input, two-input NAND circuits 43, 44, a two-input OR circuit 45, a delay stage 47 formed with inverters of an odd number, an inverter 46, and a two-input AND circuit 48.

Herein, set signals SET<0:2> (=SET(0)–SET(2)) and reset signals RESET<0:1> (=RESET(0), RESET(1)) are generated with combinations of control signals input to test mode entry circuit 40. As described below, the semiconductor memory device enters the test mode only when all logic levels of set signals SET<0:2> are at the H level and all logic levels of reset signals RESET<0:1> are at the L level.

Two-input AND circuit 41 receives reset signals RESET<0:1> with inverted logic levels respectively at first and second input terminals thereof, and outputs a result of an AND operation of the two signals. Three-input AND circuit 42 receives set signals SET<2:0> respectively at first to third input terminals thereof, and outputs a result of an AND operation of the three signals. Output signals of two-input AND circuit 41 and three-input AND circuit 42 are respectively input to first and second input terminals of two-input NAND circuit 43, and a result of an AND operation of the two signals is inverted and output.

Output signals of two-input AND circuit 41 and two-input NAND circuit 43 are then input to a subsequent flip-flop circuit formed with two-input NAND circuit 44 and two-input OR circuit 45.

Finally, an output signal of two-input NAND circuit 44 is logically inverted with inverter 46 and output as a test mode entry signal TME. A logic level of test mode entry signal TME is driven to the H level when all of set signals SET<0:1> are set to the H level and all of reset signals RESET<0:2> are set to the L level.

Further, the output signal of two-input NAND circuit 44 is logically inverted and input to a first input terminal of two-input AND circuit 48, and also is logically inverted and input to a second input terminal of two-input AND circuit 48 via delay stage 47 formed with inverters of an odd number. A result of an AND operation of the two input signals is output from an output terminal of two-input AND circuit 48 as a strobe signal STROB. The generated strobe signal STROB is set to the H level for a prescribed period determined by the number of inverters of delay stage 47 when test mode entry signal TME is at the H level.

FIG. 12B shows a structure of an example of the test mode address signal generation unit.

Referring to FIG. 12B, the test mode address signal generation unit includes a two-input NAND circuit 49 receiving test mode entry signal TME generated at the test mode entry signal generation unit shown in FIG. 12A and address signals A<0:5> (=A(0)–A(5)) from the outside, a latch circuit 52, and inverters 53–55.

A transfer gate 50 is connected between an output terminal of two-input NAND circuit 49 and latch circuit 52, and receives strobe signal STROB and inverted strobe signal STROB at the gates thereof. Transfer gate 50 is turned on in response to a timing when strobe signal STROB is driven to the H level, and then transmits an output signal of two-input NAND circuit 49 to latch circuit 52.

An output signal of latch circuit 52 is input to subsequent inverters 53, 54, and is then output from an output terminal of inverter 54 as test mode address signals TA<0:5> (=TA(0)–TA(5)). Further, the output signal of inverter 54 is output as logically inverted test mode address signals ZTA<0:5> via inverter 55.

In the structure as described above, when test mode entry signal TME at the H level and strobe signal STROB which is at the H level for a prescribed period are input, address signals A<0:5> are converted to test mode address signals TA<0:5>.

FIG. 12C shows a structure of an example of the test signal generation unit.

Referring to FIG. 12C, the test signal generation unit includes three-input NAND circuits 56, 57 to which test mode address signals TA<0:2>, TA<3:5> generated in the test mode address generation unit shown in FIG. 12B are respectively input, a two-input AND circuit 59 receiving output signals of three-input NAND circuits 56, 57, a two-input NAND circuit 60, a two-input OR circuit 61, a latch circuit 63, and inverters 62, 64.

When all of the input test mode address signals TA<0:2>, TA<3:5> are at the H level, signals of the L level are respectively output from output terminals of three-input NAND circuits 56, 57. The output signals of the L level from three-input NAND circuits 56, 57 are logically inverted and input to two-input AND circuit 59, and an output signal of the H level is then output as a result of an AND operation. The output signal of the H level is input to a first input terminal of two-input NAND circuit 60. To a second input terminal of two-input NAND circuit 60, strobe signal STROB generated at the test mode entry signal generation unit shown in FIG. 12A is input via a delay stage 58 formed with inverters of an even number. In a period during which strobe signal STROB rises to the H level, an output signal of the L level is output from an output terminal of the two-input NAND circuit.

The output signal of the L level is logically inverted and is further input to a first input terminal of two-input OR circuit 61. On the other hand, test mode entry signal TME is logically inverted with inverter 62, and is input with an inverted logic level to a second input terminal of two-input OR circuit 61. When test mode entry signal TME is at the H level, an output signal of the H level is output from an output terminal of two-input OR circuit 61. The output signal of the H level is latched with latch circuit 63, and is output as test signal TSIG of the H level via inverter 64.

As described above, in the test signal generation unit, test mode address signals TA<0:5> of the H level are latched at a timing when strobe signal STROB is set to the H level, and are decoded to test signal TSIG of the H level and output to the outside of test mode entry circuit 40 when test mode entry signal TME is activated to the H level. Therefore, strobe signal STROB determining a generation timing of test signal TSIG is required to transit from the L level to the H level when all of test mode address signals TA<0:5> are certainly set to the H level. For this reason, delay stage 58 is provided on an input terminal of strobe signal STROB as shown in FIG. 12C to delay the activation timing thereof from the activation timing of test mode address signals TA<0:5>.

Figure 13:
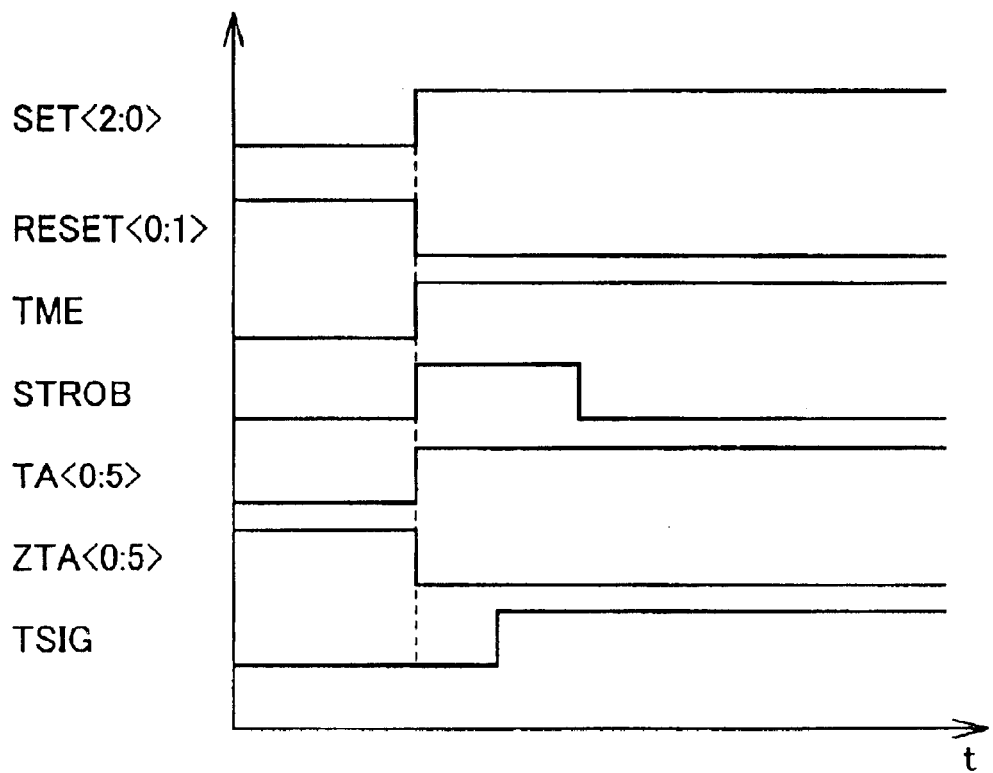
FIG. 13 is a timing chart of test mode entry circuit 40 shown in FIGS. 12A–12C.

FIG. 13 is a timing chart of test mode entry circuit 40 shown in FIGS. 12A–12C.

As shown in FIG. 13, with set signals SET<0:2> of the H level and reset signals RESET<0:1> of the L level, test mode entry signal TME of the H level is generated and, at the same time, strobe signal STROB is generated which is set to the H level for a prescribed period determined with delay stage 47 shown in FIG. 12A.

Further, when test mode entry signal TME is set to the H level to transit to the test mode, address signals A<0:5> from the outside are latched with subsequent latch circuit 52 at the timing when strobe signal STROB is set to the H level, and are converted to test mode address signals TA<0:5>. As shown in FIG. 13, test mode address signals TA<0:5> are transit to the H level at the timing when test mode entry signal TME rises to the H level.

Finally, test mode entry circuit 40 latches test mode address signals TA<0:5> in a period during which strobe signal STROB is at the H level to generate test signal TSIG of the H level. As shown in FIG. 13, test signal TSIG is activated at delayed timing from the activation timing of test mode entry signal TME. The delay time is determined with the number of inverters forming delay stage 58 shown in FIG. 12C.

Figure 14:
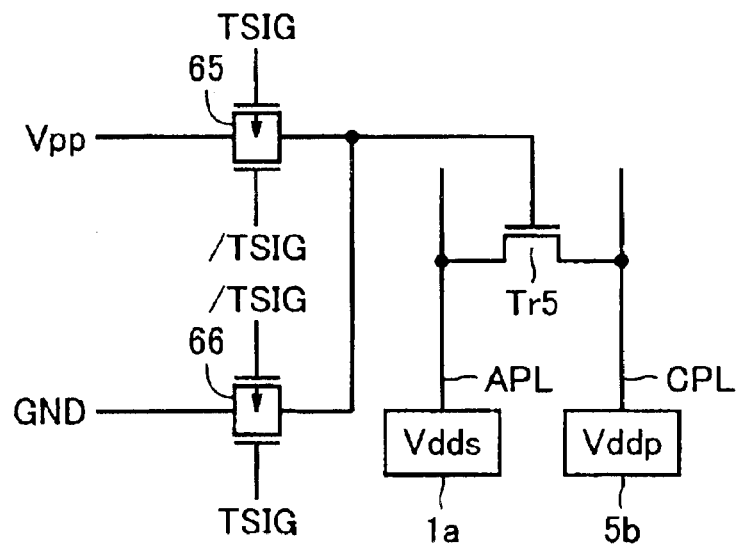
FIG. 14 shows an example of the interconnection structure of the power supply lines schematically shown in FIG. 11A.

FIG. 14 shows an example of the interconnection structure of the power supply lines schematically shown in FIG. 11A.

As shown in FIG. 14, array power supply line APL of array power generation circuit 1a and peripheral power supply line CPL of peripheral power generation circuit 5b are electrically connected by N channel MOS transistor Tr5. Transfer gates 65, 66 are respectively connected between the gate of N channel MOS transistor Tr5 and a booster circuit (not shown) generating boosted voltage Vpp and ground potential GND.

Each of transfer gates 65, 66 receives test signal TSIG generated in the test mode entry circuit shown in FIGS. 12A–12C and an inverted signal of the test signal /TSIG.

Transfer gate 65 is turned on in response to the timing when test signal TSIG is driven to the L level, and transfers boosted voltage Vpp to the gate of N channel MOS transistor Tr5. On the other hand, transfer gate 66 is turned on in response to the timing when test signal TSIG is driven to the H level, and transfers ground potential GND to the gate of N channel MOS transistor Tr5.

Therefore, when test signal TSIG is at the H level (and test signal /TSIG is at the L level), that is, during the test mode, as ground potential GND is applied to the gate of the N channel MOS transistor via transfer gate 66, the N channel MOS transistor is turned off and array power supply line APL and peripheral power supply line CPL are driven to a non-conductive state. With this, array power generation circuit 1a and peripheral power generation circuit 5b can apply independent voltages.

On the contrary, when test signal TSIG is at the L level (and test signal /TSIG is at the H level), that is, during the normal operation mode, boosted voltage Vpp is applied to the gate of N channel MOS transistor Tr5 via transfer gate 65. Therefore, N channel MOS transistor Tr5 is turned on and array power supply line APL and peripheral power supply line CPL are driven to a conductive state. With this, array power supply line APL and peripheral power supply line CPL are at the same potential, and the voltage drop of the array power supply voltage due to the wire resistance of array power supply line APL is mitigated.

As described above, according to the second embodiment of the present invention, the array power generation circuit and the peripheral power generation circuit can respectively supply independent power supply voltages by switching the connection transistor between the array power supply line and the peripheral power supply line to an off-state when entering the test mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory array including a plurality of memory blocks each having a plurality of memory cells arranged in columns and rows;
   an array power generation circuit provided corresponding to each of said memory blocks for generating an array power supply voltage transmitted to said plurality of memory cells based on a first reference voltage;
   an array power supply line for supplying said array power supply voltage to said memory block;
   a peripheral power generation circuit provided corresponding to each of said memory blocks for generating a power supply voltage for a peripheral circuit relating to each of said memory blocks based on a second reference voltage at a same potential as said first reference voltage;
   a peripheral power supply line for supplying the power supply voltage to said peripheral circuit; and
   a switching circuit for electrically coupling said array power supply line to said peripheral power supply line.

2. The semiconductor memory device according to claim 1, wherein
   said array power generation circuit is arranged in a peripheral region in a first direction of said corresponding memory block, said array power supply line is arranged extending in a second direction perpendicular to the first direction over said memory block,
   said peripheral power generation circuit is arranged in a peripheral region in a second direction of said corresponding memory block, said peripheral power supply line is arranged extending in a first direction over an outside portion of said memory block, and
   said switching circuit is arranged in a region between the adjacent memory blocks where said array power supply line and said peripheral power supply line cross each other.

3. The semiconductor memory device according to claim 1, wherein
   said switching circuit includes an N channel field-effect transistor electrically coupled between said array power supply line and said peripheral power supply line, and
   a boosted voltage is applied to a gate of said N channel field-effect transistor.

4. The semiconductor memory device according to claim 1, wherein said switching circuit includes a P channel field-effect transistor electrically coupled between said array power supply line and said peripheral power supply line, and a ground voltage is applied to a gate of said P channel field-effect transistor.

5. The semiconductor memory device according to claim 1, further comprising a test mode entry circuit for generating a test signal to enter a test mode, wherein said switching circuit performs a switching operation in response to activation/deactivation of said test signal to selectively and electrically couple said array power supply line and said peripheral power supply line.

* * * * *